United States Patent [19]
Tanida

[11] 4,311,056
[45] Jan. 19, 1982

[54] PRE-SETTING FINE TUNING DEVICE FOR A TURRET TYPE TELEVISION TUNER

[75] Inventor: Takeyoshi Tanida, Mie, Japan

[73] Assignee: New Nippon Electric Company, Ltd., Osaka, Japan

[21] Appl. No.: 97,847

[22] Filed: Nov. 27, 1979

Related U.S. Application Data

[63] Continuation-in-part of Ser. No. 14,828, Feb. 26, 1979, Pat. No. 4,253,074.

[30] Foreign Application Priority Data

Feb. 27, 1978 [JP] Japan .................................. 53/25470
Nov. 30, 1978 [JP] Japan .......................... 53/165711[U]

[51] Int. Cl.³ .......................... H03J 5/28; G05G 1/10; F16H 35/06
[52] U.S. Cl. .................................. 74/10.85; 74/10.8; 74/384; 334/51; 334/57; 334/74
[58] Field of Search .................... 74/10.8, 10.85, 384; 334/51, 57, 74

[56] References Cited

U.S. PATENT DOCUMENTS

| | | | |
|---|---|---|---|
| 4,041,422 | 8/1977 | Noji et al. | 334/51 X |
| 4,152,682 | 5/1979 | Ito et al. | 334/51 |
| 4,253,074 | 2/1981 | Tanida | 334/51 X |

Primary Examiner—Allan D. Hermann
Attorney, Agent, or Firm—W. G. Fasse; D. F. Gould

[57] ABSTRACT

The present television fine tuning is so constructed that an initial rotation establishes the fine tuning state and that a continued rotation of the fine tuning shaft performs the fine tuning. For this purpose the present tuner comprises a fine tuning driving member, a rotation transmitting idler member, a plate spring for supporting the idler member and a fine tuning driven member. The driving member includes a fine tuning shaft, a slide gear and a slip clutch mounted in front of a chassis concentrically around a channel selector shaft supported in the chassis. The spring member has freely slidable end portions disposed between the chassis and the slide gear for biasing the slide gear in the forward direction. The idler member is movably arranged on the spring member for transmitting the fine tuning movement. The slide gear has a gear back of a flange and a driven cam surface in the front of the flange and is operatively mounted around the slip clutch. The fine tuning shaft has a driving cam cooperating with the driven cam surface of the slide gear. A change in the shape of the plate spring shifts the idler member axially in response to initial rotation of the fine tuning shaft.

15 Claims, 10 Drawing Figures

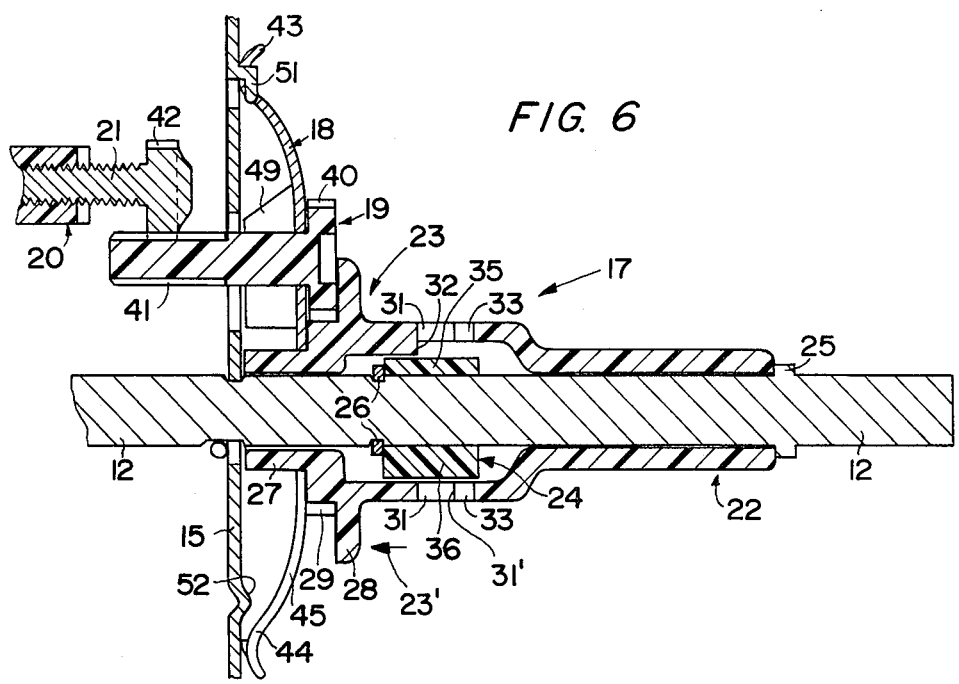
FIG. 6
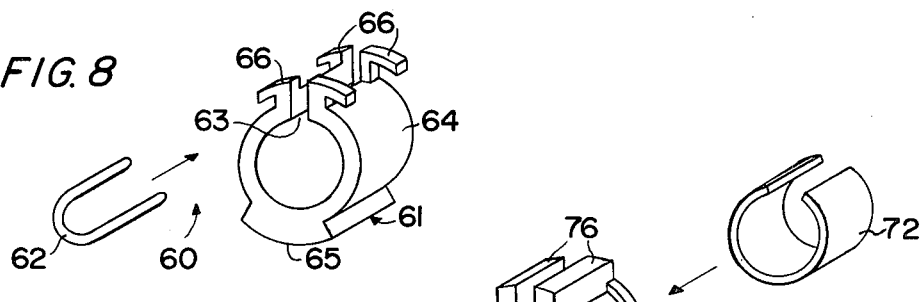
FIG. 8
FIG. 9

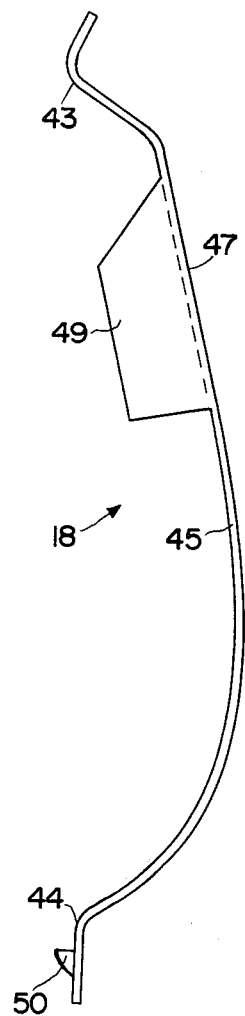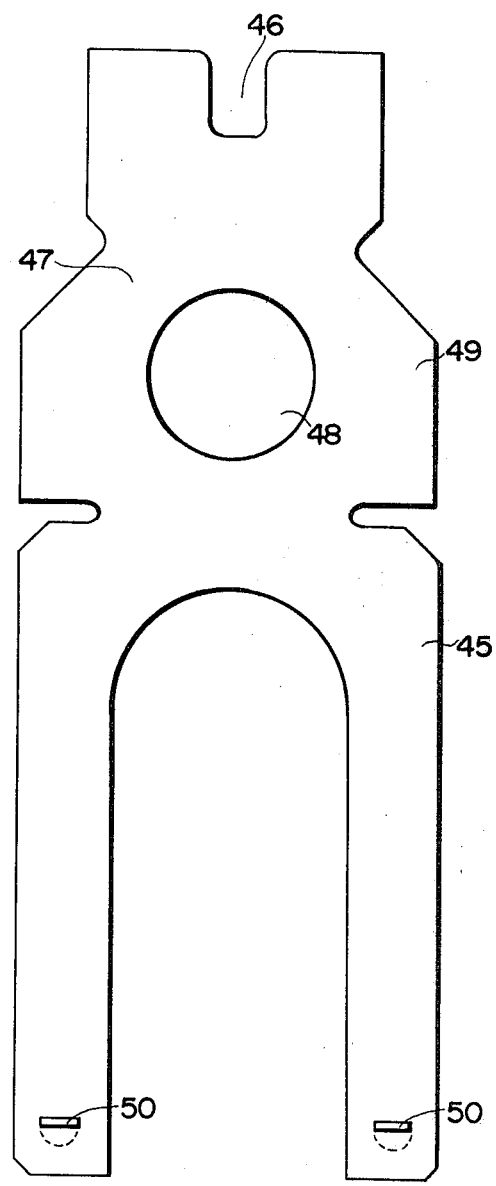

PRE-SETTING FINE TUNING DEVICE FOR A TURRET TYPE TELEVISION TUNER

CROSS REFERENCE TO RELATED APPLICATION

This application is a continuation-in-part application of my copending application U.S. Ser. No. 014,828; filed on Feb. 26, 1979, now U.S. Pat. No. 4,253,074.

BACKGROUND OF THE INVENTION

The present invention relates to a memory fine tuning arrangement used for television tuners. More particularly, the invention relates to a television tuner of the type which provides a so-called pre-setting fine tuning arrangement for an automatic fine tuning adjustment for each individual television channel. Specifically, the present invention is directed to an improved and simplified fine tuning mechanism used for rotary pre-setting fine tuning devices and which is manufactured economically by a minimum number of parts.

Generally, mechanical channel selecting devices for VHF television tuners are mainly classified as rotary-switching types or turret types. Turret type tuners include an incrementally rotatable channel selector shaft for selectively connecting certain ones of a plurality of tuned circuit elements for each of a plurality of channel selector positions. For example, one such turret tuner arrangement is disclosed in U.S. Pat. No. 4,128,821, wherein a rotatable turret having a plurality of tuning coil units, is rotatably mounted on a chassis base.

For clear reception in each of the channel positions of the selector shaft, it is customary to include in the local oscillator circuit an adjustable impedance device. This impedance device is conventionally adjusted by means of a fine tuning shaft concentrically mounted with respect to the channel selector shaft. The fine tuning shaft is connectable by the viewer or user to adjust the tuning impedance for each predetermined position of the selector shaft. Various memory fine tuning arrangments have been proposed to maintain individual channel tuning arrangements once they have been established by the user or operator without requiring any adjustment of the fine tuning shaft of the tuner by the user each time a particular channel is selected. One such arrangement is the push pre-setting type fine tuning device which requires the operator to push in a control knob of the fine tuning shaft while maintaining pressure on the knob to rotate the same to adjust a fine tuning element within the tuner. The other arrangement is a rotary pre-setting type fine tuning device which requires the operator to only rotate a control knob of the fine tuning shaft for fine tuning adjustment. These devices are particularly useful on turret type television tuners having tuned coil assemblies or units for each channel. These coil units are removably mounted in the rotatable turret structure, and are provided individually with an oscillator coil, the inductance of which may be adjusted by means of an adjustable element which extends into an opening in the end of the coil units adjacent the oscillator coil.

Since television tuners are made in large volumes, in order to be commercially competitive, it is desirable to provide a low cost pre-setting fine tuning device with a minimum number of parts which may be assembled in an easy and simple manner. The fine tuning device requires a mechanical arrangement for translation of rotary motion of the fine tuning shaft into rotary motion of the adjustment element, since the fine tuning shaft is offset laterally from the axis of the adjustment element in the individual coil units. Further, engagement of the fine tuning shaft with the adjustment element must terminate automatically when the user releases the fine tuning shaft so that the turret is free to rotate to another channel position. For example, such fine tuning devices are disclosed in U.S. Pat. Nos. 3,316,770; 3,466,549; 4,041,422; 4,128,821; and 4,152,682 for push pre-setting type memory fine tuners, and in U.S. Pat. Nos. 3,183,726 and 3,898,879 for rotary pre-setting type memory fine tuners. U.S. Pat. No. 4,172,390; granted on Oct. 30, 1979, discloses a fine tuning device including a pivotally mounted member on the front wall of the chassis base with a coil spring between the member and the front wall to exert a bias force on the member in a predetermined direction. It has been found that the number of parts of such fine tuning devices may be still further reduced thereby decreasing the manufacturing costs and making the assembly easier.

OBJECTS OF THE INVENTION

In view of the above it is the aim of the invention to achieve the following objects singly or in combination:

to provide a new and improved memory fine tuning device for television tuners wherein the construction is simplified and the fine tuning of the tuner in each channel selecting position is positively assured;

to provide a television fine tuner using a fine tuning driving member together with a plate spring member for mounting an idler member for transmitting the fine tuning movement, on the front wall of the chassis, in such a simple manner that it can be manufactured and assembled most economically by using a minimum number of parts; and to provide a simplified rotary pre-setting fine tuning device for turret type television tuners, in which a fine tuning device member comprises a fine tuning shaft, a slide driving gear, and a slip clutch mounted on a channel selector shaft in front of the chassis.

SUMMARY OF THE INVENTION

In accordance with the present invention a memory fine tuning mechanism is provided which utilizes a fine tuning driving member having a fine tuning shaft, a slide gear, and a slip clutch mounted on the channel selector shaft together with a leaf or plate spring member on the front wall of the chassis. The spring member, which biases the slide gear in the thrust direction, supports on its inclined flat surface an idler member for transmitting the fine tuning movement of the fine tuning shaft through the slide gear to a fine tuning adjustable element. The fine tuning shaft is mounted concentrically in the fine tuning driving member and rotatable around the channel selector shaft. The fine tuning driving member is connected with the slide gear by cam means. The slip clutch is mounted within a space between the channel selector shaft and the slide gear at a given position of the selector shaft. That is, the present fine tuning device comprises the fine tuning driving member mounted concentrically around the channel selector shaft supported between the front and rear walls of the chassis, the spring member disposed between the chassis, the idler member for transmitting fine tuning movement rotatably supported in the spring member, and the fine tuning adjustable element movably supported in each end of the respective coil units.

The cam means for connecting the fine tuning shaft and the slide gear is constituted by a driving cam surface formed by the rear end of the fine tuning shaft and a driven cam surface formed by the front end of the slide gear. The slip clutch formed by a resilient collar of lubricant plastic material is disposed in the space formed by the inside surfaces of both the enlarged or greater diametrical portions of the fine tuning shaft and the slide gear and the outside surface of the channel selector shaft. To make sure that a frictional force is applied to the slip clutch, a metal spring may be applied to the resilient collar. The inner surface of the collar frictionally is engaged against the outer surface of the channel selector shaft. Further the fine tuning shaft and the slip clutch are operatively positioned on the channel selector shaft by using retaining means so that the fine tuning shaft may freely rotate when torque is applied to it while the slip clutch is frictionally rotated through the slide gear. The slip clutch is provided with recessed and raised portions on the outer surface of the resilient collar. The slide gear is provided with raised and recessed portions along to the axial direction on the inner surface of the greater diametrical portion thereof so that both the recessed and raised portions are connected against rotational relative displacement while the frictional rotation of the slide gear and of the slip clutch is permitted.

The present fine tuning device utilizes the plate spring member to impart a resilient biasing force to the slide gear for disconnecting the idler member from the fine tuning adjustable element, and to rotatively hold the idler member for transmitting the fine tuning movement. The spring member is provided with a bifurcated portion abutting the slide gear for biasing the slide gear. The spring member has curved free ends slidably abutting against predetermined positions on the front wall surface of the chassis. The parts of spring and idler members are the same as in my copending U.S. patent application Ser. No. 014,828 so as to use these parts in both tuner types. Accordingly, by the fine tuning device of the present invention, reductions in the number of parts and in the assembling time are achieved. For example, a pivotally mounted member used in ordinary rotary pre-setting type mechanisms as disclosed in U.S. Pat. No. 3,183,726, and in U.S. Pat. No. 4,172,390 is eliminated and the number of heretofore necessary parts is reduced.

BRIEF FIGURE DESCRIPTION

In order that the invention may be clearly understood, it will now be described, by way of example, with reference to the accompanying drawings, wherein:

FIG. 6 is an enlarged sectional view along the line 6—6 in FIG. 3 but showing a fine tuning state;

FIG. 7 is an enlarged view of a spring member used in the device, in which FIG. 7(a) is a side view and FIG. 7(b) is an unfolded view thereof;

FIG. 8 is a perspective view of another embodiment of the slip clutch used in the present device; and FIG. 9 is a perspective view of a modification of FIG. 8.

DETAILED DESCRIPTION OF PREFERRED EXAMPLE EMBODIMENTS AND OF THE BEST MODE OF THE INVENTION

Figure 1:
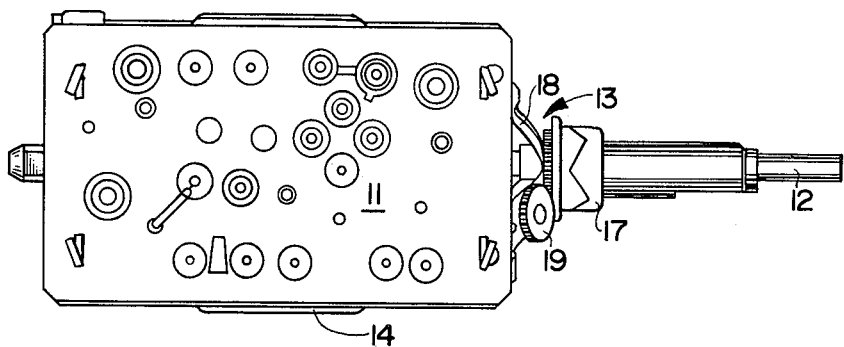
FIG. 1 is a top view of a tuner employing a fine tuning device in accordance with this invention.
Figure 2:
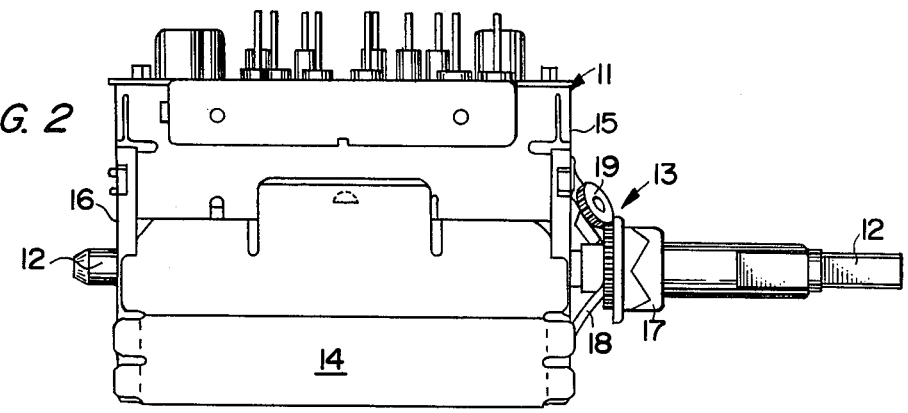
FIG. 2 is a side view of the tuner of FIG. 1.
Figure 3:
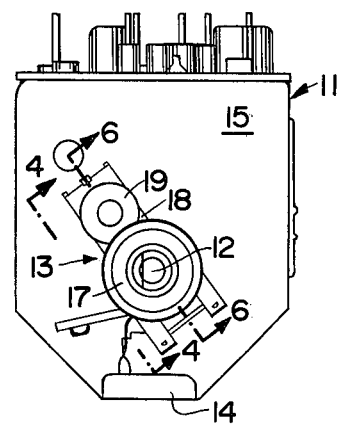
FIG. 3 is a front view of the tuner of FIG. 1.

The drawings illustrate a memory fine tuning device of the rotary pre-setting type useful for a turret television tuner according to the present invention. In FIGS. 1 to 3, the VHF turret type tuner comprises a chassis 11, a main channel selector shaft 12, a fine tuning device 13 of the rotary pre-setting type, and a shield cover 14. The chassis 11 has a front wall 15 and a rear wall 16, between which the channel selector shaft 12 carries a rotatable turret, not shown since it is not part of the invention. The channel selector shaft 12 is journalled in both the front and rear walls of the chassis 11 with detent means permitting a rotational indexing movement but preventing a continuous rotation of the channel selector shaft 12. In other words, a plurality of coil units are mounted within the shielded chassis at the periphery of the supporting discs fixed on the channel selector shaft 12 to form a drum shaped turret.

Figure 4:
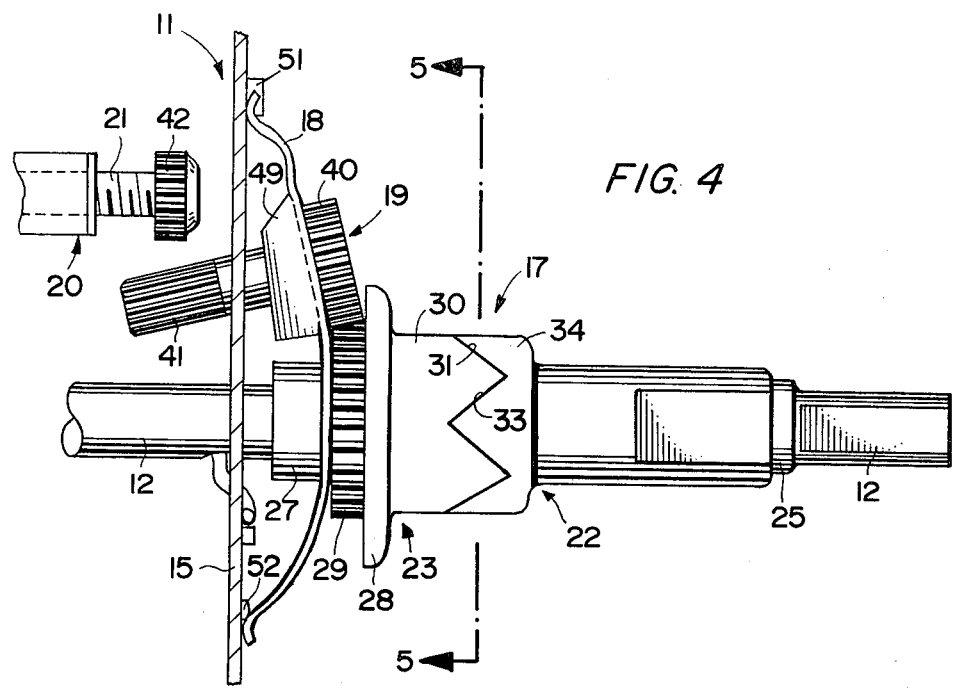
FIG. 4 is an enlarged side view along the line 4—4 in FIG. 3 of a partial portion of a fine tuning device of the tuner of FIG. 1.
Figure 5:
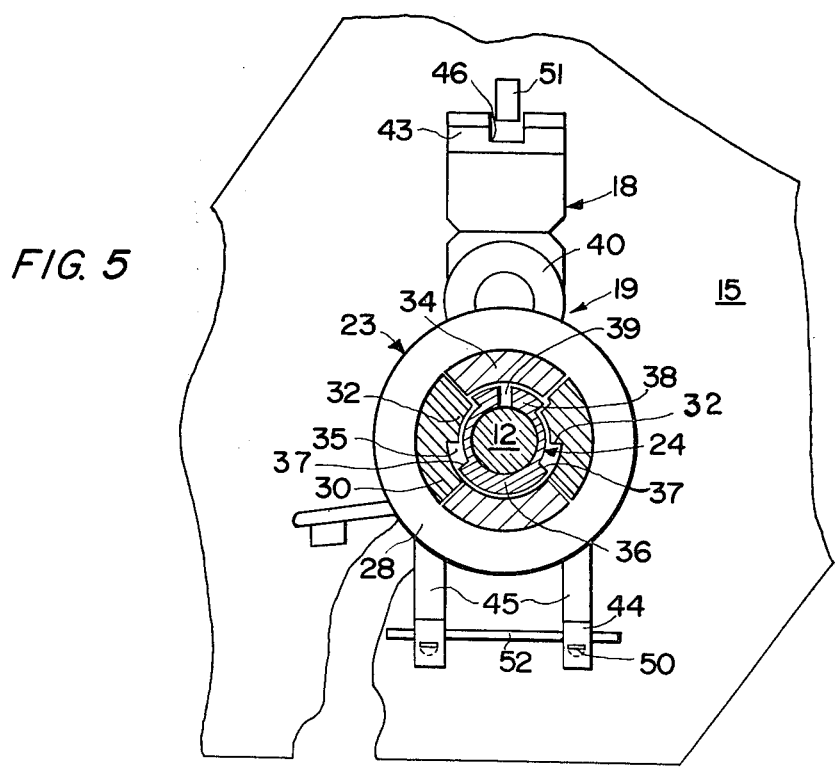
FIG. 5 is a partial sectional front view along the line 5—5 in FIG. 4.

As more clearly shown in FIGS. 4 to 6, the fine tuning device of the present invention is assembled on the front wall 15 of the chassis 11. FIG. 4 illustrates the released or inoperative state of the fine tuning device which comprises fine tuning driving means 17 mounted concentrically around the selector shaft 12. A plate spring member 18 is held between the front wall 15 of the chassis 11 and the rear end portion of the fine tuning driving means 17. An idler member 19 for transmitting fine tuning movement is supported in the plate spring member 18, to be rotated freely. The fine tuning operation is achieved by the engaged gears 29 and 40 as shown in FIG. 6 in which a fine tuning driven element or adjustable screw 21 which extends into an opening of a coil unit 20 adjacent to an oscillator coil, may be moved back and forth by rotating the fine tuning driving means 17 when the latter is in the initial rotated condition as shown in FIG. 6. When no fine tuning operation is intended, the fine tuning adjustable screw 21 is disengaged from the idler member 19 as is shown in FIG. 4 by the action of the spring 18, whereby the channel selecting operation may be done by further rotating the selector shaft 12. The present fine tuning device for a turret type VHF tuner is pre-settable by rotation and is characterized in that the fine tuning driving means 17 comprise a fine tuning shaft 22, a slide gear 23, and a slip clutch 24 mounted around the channel selector shaft 12 by means of retainers 25 and 26 as shown in FIG. 6. The fine tuning shaft 22 and the slip clutch 24 are rotatable relative to the selector shaft 12 between the retainers 25 and 26 because the selector shaft 12 is held in a selected position by the above mentioned conventional detent means, not shown. The slide gear 23 is mounted to be movable in the axial direction 23' of the selector shaft 12 within the spacing defined between the retainer 26 and the front wall 15 of the chassis 11. In the absence of an operating force, the resilient force of the plate spring 18 always biases the slide gear 23 to the right as shown in FIG. 4. At the rear portion of the slide gear 23, there are provided a bushing 27 having a given diameter and extending in the axial direction, a flange portion 28 extending in the radial direction and a peripheral gear 29. The gear 29 is able to engage the idler member 19 for transmitting the fine tuning movement when the slide gear 23 is in the position shown in FIG. 6 as a result of an applied operating force. At the front end of the slide gear 23, a greater diametrical portion 30 is provided, which forms a driven cam face 31 on the front end and a pair of raised portions 32 on the inner surface, see FIGS. 4 and 5. The cam face 31 engages a corresponding driving cam face 33 formed at the rear end of a greater diametrical portion 34 of the fine tuning shaft 22. The driving cam face 33 has the same diameter as the driven cam face 31 on the slide gear 23. The slip clutch 24 comprises a resilient collar 36 having a pair of recesses 35 between raised shoulders 37 and 38. The raised portions 32 of the front end portion 30 cooperate with the recesses 35 of the collar 36. A gap 39 is formed between the raised end shoulders 38. The resilient collar 36 is made of lubricant plastic materials, such as of molded plastics having added thereto a small amount of lubricant agent. The inner diameter of the collar 36 is smaller than the outer diameter of the channel selector shaft 12 to provide a frictional connection between the collar 36 and the shaft 12 thereby providing a frictional force therebetween. To assure the frictional force, metal spring means as hereinafter described and shown in FIG. 8 or 9 may be assembled on the resilient collar 36.

The idler member 19 is provided with a first gear 40 formed at the periphery of the head portion of the idler member 19 for engagement with the peripheral gear 29, and with a second pinion gear 41 formed around the rod portion of the idler member 19 for engagement with a pinion 42 formed at the top of the fine tuning adjustable screw 21. Preferably, the fine tuning driving member 17 and the idler member 19 are made as molded parts of plastic materials such as a resin material which is light and relatively inexpensive.

Upper and lower free ends 43 and 44 of the plate spring member 18 which resiliently biases the slide gear and holds the idler member 19, touch resiliently the front wall 15 of the chassis 11. The plate spring member 18 is freely supported on the bushing 27 of the slide gear 23 at an opening of a bifurcated portion 45 of the plate spring member 18. The circumferential portion of the bifurcated portion 45 resiliently contacts a rear end side of the peripheral gear 29 of the slide gear 23. As shown in FIG. 7, the plate spring member 18 is made from a stamping sheet of stainless steel sheet metal of which the upper end 43 is provided with a slot 46 forming a sliding guide on the front wall 15 of the chassis 11. A flat portion 47, a hole 48 and a pair of side portions 49 are provided for holding the idler member 19. The side portions 49 are folded at the right angle so that its edges may be contacted in parallel with the front wall 15 of the chassis 11, when the spring member 18 is deformed. The side portions 49 serve to limit the deformation of the spring member 18 and to reinforce the flat portion 47. The lower free end 44 comprises a pair of legs of the bifurcated portion 45. Each of said legs is provided with a cut-out projection 50 as a stopper.

On the other hand, a guiding projection 51 and a guiding boss 52 are formed on the front wall 15 of the chassis 11 to prevent dislocation of the plate spring member 18. Accordingly the plate spring member 18 is able to move smoothly and to change its shape when the fine tuning shaft 22 is initially rotated to move the slider gear 23 in the axial direction.

FIGS. 8 and 9 illustrate different slip clutches used for the fine tuning device of the present invention, wherein a suitable and stable friction may be obtained by using metal spring means. In FIG. 8, a slip clutch 60 comprises a plastic collar 61 similar to the collar 36 in FIG. 5 and a U-shaped wire spring 62. The wire spring 62 is assembled to the collar 61 provided with a gap 63, thin or recessed portions 64 and thick and end raised portions 65, 66. The U-shaped spring 62 is clipped between the raised portions over the gap 63 in the axial direction to maintain friction. The frictional force may be adjusted by the resiliency of plastic materials and wire spring materials.

In FIG. 9 another slip clutch 70 comprises a plastic collar 71 and a strip or leaf spring 72 assembled around a thin or recessed portion 74 of the plastic collar 71. The collar 71 is provided with a peripheral rim portion 75 and a pair of thick or raised portions 76 between which a gap 73 is formed. The metal spring 72 of the collar type is seated on the recessed portion 74 encircled by the rim portion 75. For using this simplified structure of the collar 71, the inner surface of the slide gear is provided with a single recessed portion corresponding to the pair of raised portions 76 and the gap 73. Instead of the wire spring 62 the spring 72 is also assembled to the collar 61 of FIG. 8. This type of slip clutch constitutes at this time the best mode because of its simple and stable structure.

The plastic collar for the slip clutches is molded of polyacetal resins such as DELRIN (RTM) whereby fine particles of a lubricant such as disulfide molybdenum are added to the resin. The lubricant is added to the mold plastic materials in the range of 5~20 weight percent. It is preferred to use polyfluoroethylene as a lubricant. The use of the lubricant serves to achieve a smooth movement with the suitable frictional force for a fine tuning operation. Especially, the use of a spring 72 embracing the recessed portion 74 of the plastic collar 71 is preferred to obtain a suitable stable friction for a long time, since the plastic collar 71 having a lubricant therein provides a smooth movement while the strip 72 around the collar assures a stable frictional force.

In the above described mechanical arrangement the fine tuning operation is accomplished by a continuous rotation of the fine tuning shaft 22, whereby the components cooperate as follows. At the beginning of a fine tuning operation all components are in the position shown in FIG. 4. While the shaft 22 is rotated continuously, clockwise or counterclockwise, alternate pairs of cooperating cams 31 and 32 remain in cooperating contact at all times even if the cams slide somewhat relative to each other for converting the rotation of the shaft 22 first into a small rotation of the slide gear 23, then into an axial movement of the slide gear 23, and then again into rotation of the slide gear 23. The first small rotation takes place until a raised portion 32 of the slide gear 23 contacts the respective shoulder 37 of the collar 36 of the slip clutch 24. The friction force between the collar 36 and the shaft 12 is, at this time, large enough to overcome the biasing force of the spring 18 whereby the slide gear 23 is moved axially as indicated by the arrow 23' in FIG. 6 until the bushing 27 abuts against the wall 15. During this axial movement of the slide gear 23 the cooperating cams 31, 33 have moved relative to each other as indicated at 31' in FIG. 6. This axial movement of the slide gear 23 presses the spring 18 against the wall 15 whereby the biasing force of the spring 18 increases until it overcomes the friction force between collar 36 and shaft 12, whereby the slide gear 23 is rotated again to transmit its rotation through the gears 29, 40 and 41, 42 to the fine tuning screw 21.

Thus, when the components are in the position shown in FIG. 6 the peripheral gear 29 of the slide gear 23 engages the first gear 40. The pinion gear 42 of the screw 21 simultaneously engages the second gear 41 so as to provide an operative engagement or coupling of the gears in the mechanism. During the continued rotation of the fine tuning shaft 17, the slide gear 23 is rotated against the frictional resistance of the slip clutch 24 relative to the shaft 12, since the axial movement is stopped when the rear end of the bushing 27 of the slide gear 23 abuts against the front wall 15 of the chassis 11 as described above. Therefore, the fine tuning adjustable screw 21 is able to move back or forth within the coil unit 20 for achieving a desired fine tuning by continuously rotating the shaft 22 in one or the other direction.

In the above embodiment of this invention, the retainer 26 may be replaced by an integral part of the selector shaft 12, similar to the front retainer 25. Accordingly, the minimum number of necessary parts to assemble the fine tuning mechanism of this invention is five, namely, the fine tuning shaft 22, the slide gear 23, slip clutch 24, the plate spring member 18, and the idler member 19. The reduction of the number of the necessary parts makes the assembly easier, reduces the manufacturing costs substantially, and increases the industrial practical value of such tuners.

In the present tuner the spring member supports the rotation transmitting idler member whereby the axial direction of movement of the idler member may be changed or shifted by deformation of the spring member. When the fine tuning shaft is initially operated the shape of the spring member is changed while the first gear of the idler member is securely engaged with the peripheral gear of the slide gear. At the same time, the second gear of the idler member is engaged with the fine tuning screw to permit a memory fine tuning for one of the tuning coil units selected by the channel selecting shaft.

Although the invention has been described with reference to specific example embodiments it is to be understood, that it is intended to cover all modifications and equivalents within the scope of the appended claims.

What is claimed is:

1. In a television tuner of the turret type wherein a selector shaft carries a rotatable turret in a chassis, and which includes a plurality of tuning coil units corresponding to different television channels each tuning coil unit having an adjustable element, the improvement comprising memory fine tuning means for adjusting any one of said adjustable elements when said rotatable turret is in a predetermined position, said fine tuning means comprising fine tuning driving means mounted concentrically around said selector shaft, said fine tuning driving means including a fine tuning shaft, slide gear means and cam surface means for rotatably connecting said slide gear means to said fine tuning shaft, slip clutch means rotatably connected to said slide gear means, spring means disposed on said chassis for normally biasing said slide gear means in a direction away from said chassis; and idler means supported in said spring means for transmitting rotary movement of said fine tuning driving means to said adjustable element for adjusting said adjustable element in a selected one of said tuning coil units, and wherein the shape of said spring means at the time of the initial rotation of said fine tuning shaft is changed by the movement of said slide gear means in response to a continuous rotating force for engaging said idler means with said adjustable element whereby a memory fine tuning is provided.

2. The tuner of claim 1, wherein said spring means comprise a resilient plate spring having freely slidable end portions and a bifurcated portion for mounting said plate spring on said selector shaft.

3. The tuner of claim 2, further comprising guiding means in said chassis, at least one of said end portions of said resilient plate spring being positioned for cooperation with the guiding means.

4. The tuner of claim 1, wherein said slide gear means comprise a first portion of increased diameter, a radially extending flange portion, a peripheral gear portion and a portion of reduced diameter relative to said first portion, and wherein said idler means comprise a first gear positioned in the forward surface of said spring means for engaging said peripheral gear portion and said first gear.

5. The tuner of claim 4, wherein said adjustable element is provided with a pinion, and wherein said idler means comprise a second gear positioned within said chassis for engagement of said second gear with said pinion, when said second gear is shifted by changing the shape of said spring means.

6. The tuner of claim 1, wherein said selector shaft comprises two spaced stop members, said fine tuning shaft and said slip clutch means being mounted between said two stop members on said selector shaft at a given position, said slide gear means being mounted on said slip clutch means and located between the front wall of said chassis and said fine tuning shaft with a spacing so as to permit the sliding of said slide gear means on said selector shaft into a fine tuning position.

7. A fine tuning device for a turret type television tuner, comprising chassis means, channel selector shaft means supported in said chassis means, fine tuning driving means mounted concentrically around said channel selector shaft means, said fine tuning driving means comprising a fine tuning shaft, a slide gear member and cam means for rotatably connecting said fine tuning shaft to said slide gear member, and slip clutch means frictionally mounted on said selector shaft means and rotatably connected with said slide gear member, said slide gear member having a radially extending flange and a peripheral gear on said flange, a plate spring member disposed on the front wall of said chassis means for biasing said fine tuning driving means in a forward direction opposite to the sliding direction of said slide gear member, idler means supported in said plate spring member and comprising a first gear and a second gear, coil means, fine tuning adjustable screw means movable within the respective coil means and provided with a pinion gear, wherein the axial line of said idler means is shiftable by changing the position of said plate spring member when said fine tuning shaft is initially rotated, whereby a fine tuning operation of said fine tuning shaft is possible by a gear meshing between said peripheral gear, the first gear, said second gear, and said pinion gear.

8. The fine tuning device of claim 7, wherein said plate spring member is disposed between the front wall of said chassis means and the slide gear member of said fine tuning shaft means, said plate spring member having a bifurcated portion through which said selector shaft means extend, whereby the assembly of said plate spring member is facilitated.

9. The fine tuning device of claim 7, wherein said front wall of said chassis means comprises projecting guiding means, said plate spring member having at least one end portion located for sliding and guiding engagement with said guiding means to permit sliding in a given direction.

10. The fine tuning device of claim 7, wherein said fine tuning driving means and said idler member are made of synthetic plastic material by die molding.

11. The fine tuning device of claim 7, wherein said slide gear member and said slip clutch means are rotationally connected by means for contacting recessed and raised portions formed along to the axial direction thereof so as to permit the movement of said slide gear member in the axial direction in response to the initial rotation of said fine tuning shaft.

12. The fine tuning device of claim 7, wherein said slip clutch means comprise a resilient collar having a recessed portion and a raised portion formed on the inner surface of the slide gear member, to rotate said slip clutch means together with said slide gear member.

13. The fine tuning device of claim 12, wherein said slip clutch means further comprise a metal spring clipping said resilient collar to limit the gap caused by both ends of said resilient collar.

14. The fine tuning device of claim 12, wherein said slip clutch means comprise a plastic molded collar and a metal spring assembled to said plastic molded collar, said collar being made of polyamidacetal resin having added thereto fine particles of a lubricant.

15. The fine tuning device of claim 14, wherein said metal spring of said slip clutch means is formed of a metal strip in collar shape embracing the outside surface of said recessed portion of said plastic collar.

* * * * *